United States Patent [19]

White et al.

[11] 4,092,610
[45] May 30, 1978

[54] MODULATED CARRIER AMPLIFYING SYSTEM

[75] Inventors: Benjamin J. White, Middletown, R.I.; George Moreau, Westport, Mass.; Robert E. Dworkin, Middletown, R.I.

[73] Assignee: Raytheon Company, Lexington, Mass.

[21] Appl. No.: 769,379

[22] Filed: Feb. 17, 1977

[51] Int. Cl.² .............................................. H03F 21/00
[52] U.S. Cl. .................. 330/207 A; 330/10; 330/146
[58] Field of Search ...................... 330/10, 146, 207 A

[56] References Cited

U.S. PATENT DOCUMENTS

| | | | |
|---|---|---|---|
| 3,157,839 | 12/1964 | Brown et al. | 330/146 X |
| 3,899,745 | 8/1975 | Fletcher | 330/207 A |
| 4,016,501 | 4/1977 | Jasinski et al. | 330/10 |

Primary Examiner—Lawrence J. Dahl
Attorney, Agent, or Firm—David M. Warren; Joseph D. Pannone; Milton D. Bartlett

[57] ABSTRACT

A system providing linear amplification of a signal including a pulse duration modulation of the signal upon a carrier signal, the system further including a plurality of amplifying units which are sequentially activated by the modulated carrier. The amplifying units are arranged in the form of a bridge circuit, the nodes of which are coupled to a load, the amplifying units including transistors which are driven alternately in states of conduction and nonconduction for maximizing power coupled to the load while minimizing power dissipated in the transistors. A filter connected between the amplifying units and the load attenuates signals at the frequency of the carrier so that the waveform of the signal applied to the load duplicates the waveform of the signal at the input of the system.

13 Claims, 6 Drawing Figures

AMPLIFIER SYSTEM, 38

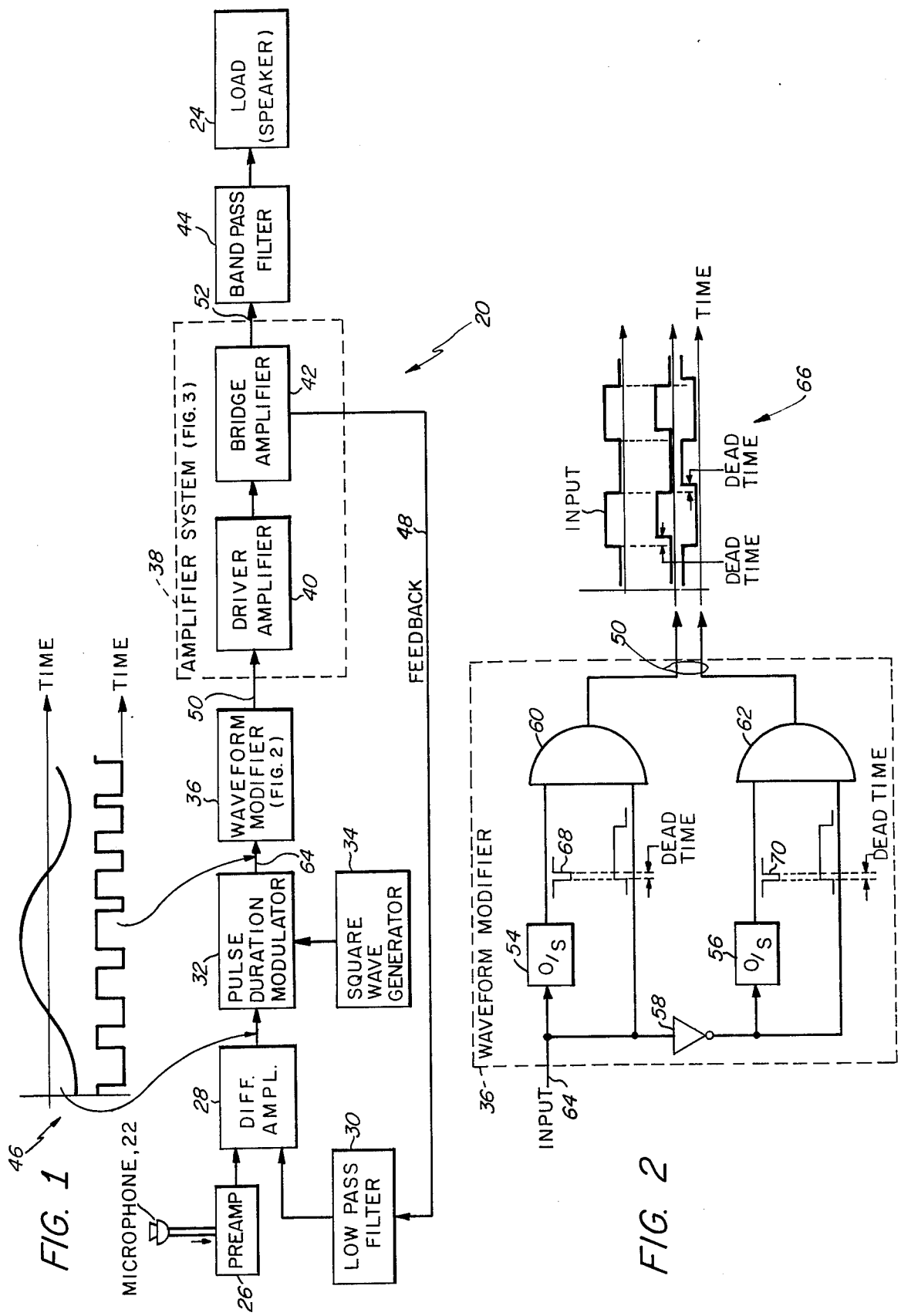

FIG. 3

MODULATED CARRIER AMPLIFYING SYSTEM

BACKGROUND OF THE INVENTION

Amplifiers of electric signals frequently use an amplifying element such as a transistor or silicon controlled rectifier which is operated alternately in a state of nonconduction, and in a state of full conduction in which a saturation current or near saturation current is flowing in the amplifying element. Such operation of the amplifying element minimizes the product of voltage times current and, hence, minimizes the dissipation of power in the amplifying element itself while permitting a maximum amount of power to be coupled to a load. Assuming, by way of example, that the amplifying element is a transistor, it is well known that the idealized condition of no power dissipation within the transistor itself is not obtained but, rather, power is dissipated in the transistor during the rise and fall times of a signal waveform as well as by the introduction of and removal of electric charges in the base-emitter region of the transistor.

A problem arises in that ever increasing power capability is required of amplifiers used in communication systems such as in underwater sonic signaling systems wherein higher powers of radiated sonic energy are desired for longer range communication. A single transistor may be unable to provide the desired power and a plurality of transistors need be coupled to the load with the resulting danger, particularly in a bridge type circuit, that an imbalance in the signals instantaneously present in each of the transistors may cause the destruction of one of the transistors.

A further problem results from the fact that a transistor amplifier wherein the transistors are alternately driven in states of conduction and nonconduction, while being capable of retaining phase data of the signal being amplified, removes all variations in the amplitude of the signal and thereby destroys amplitude data. This is disadvantageous in an application wherein it is desired to apply a signal of varying amplitude to the load.

SUMMARY OF THE INVENTION

The aforementioned problems are overcome and other advantages are provided by an amplifying system which, in accordance with the invention, provides for the modulation of an input signal upon a carrier signal by a pulse duration modulator wherein the durations or widths of sequential pulses of the carrier signal are varied in accordance with variations in the amplitude of the input signal. The system includes a plurality of amplifier units which are sequentially operated for amplifying the modulated carrier signal and for coupling the modulated carrier signal to a load. Filter circuitry coupled between the plurality of amplifying units and the load provides a pass band which passes the spectrum of the input signal, the pass band being sufficiently narrow to exclude harmonics of the input signal and the carrier from the load. In a preferred embodiment of the invention, the plurality of amplifying units is arranged in the configuration of a bridge circuit with opposite nodes thereof being coupled via a transformer to the load. Each amplifying unit may comprise an amplifying element such as a transistor or silicon controlled rectifier. For ease in describing the invention, it will be presumed hereinafter that the amplifying units utilize transistors, it being understood that other amplifying elements may be utilized.

In accordance with the invention, a major portion of power produced by the amplifying units is coupled to the load while a minor portion of the power is dissipated in the transistors. The amplifying units have a mode of operation wherein the transistors are in states alternately of full conduction or nonconduction, the state of full conduction providing for the flow of saturation current or near saturation current at the emitter terminal of the transistor. Waveform modifying circuitry and a driver amplifier are coupled between the modulator and the bridge circuit of amplifying units for inducing the states of conduction in the transistors. Each amplifying unit includes a conduction turn-off circuit, responsive to the signal of the driver amplifier, for terminating the state of conduction in the transistor of that amplifying unit by withdrawing electric charges from the base-emitter junction of the transistor which accumulate during the conduction state. The conduction turn-off circuit includes its own power supply in the form of a capacitor which is charged during the conduction state so that the circuit can operate after the termination of a pulse of the signal from the driver amplifier. The waveform modifying circuit provides for a delay, or dead time, at the leading edge of a pulse signal of the modulated carrier to provide an interval of time during which the conduction turn-off circuit is operative. The driver amplifier, in a preferred embodiment of the invention, has a push-pull configuration for alternately activating pairs of the amplifying units in the bridge circuit of amplifying units. A damper circuit, located within the driver amplifier and coupled to the modifying circuit, is activated during the dead time to preserve the dead time portion of the waveform of an output signal of the driver amplifier. The use of a single driver amplifier for all of the amplifying units preserves synchronism in their operation to insure that current flows to the load without danger of the current bypassing the load via one of the amplifying units. A diode clamp circuit at the input to the transistor in each amplifying unit prevents deep saturation of the transistor and thereby maximizes the switching speed of the transistor to minimize the power dissipated therein.

BRIEF DESCRIPTION OF THE DRAWINGS

The aforementioned aspects and other features of the invention are explained in the following description taken in connection with the accompanying drawings wherein:

FIG. 1 is a block diagram of the amplifying system of the invention showing the amplification of an electric signal produced by a microphone and rebroadcast by a speaker, the Figure also showing the waveforms of the signals incident upon an exiting from a modulator of the system;

FIG. 2 is a diagram of a waveform modifier of FIG. 1;

FIG. 3 is a schematic diagram of a driver amplifier and a bridge amplifier of FIG. 1 with their interconnections via a filter to the load of FIG. 1;

DESCRIPTION OF THE PREFERRED EMBODIMENT

Figure 3:
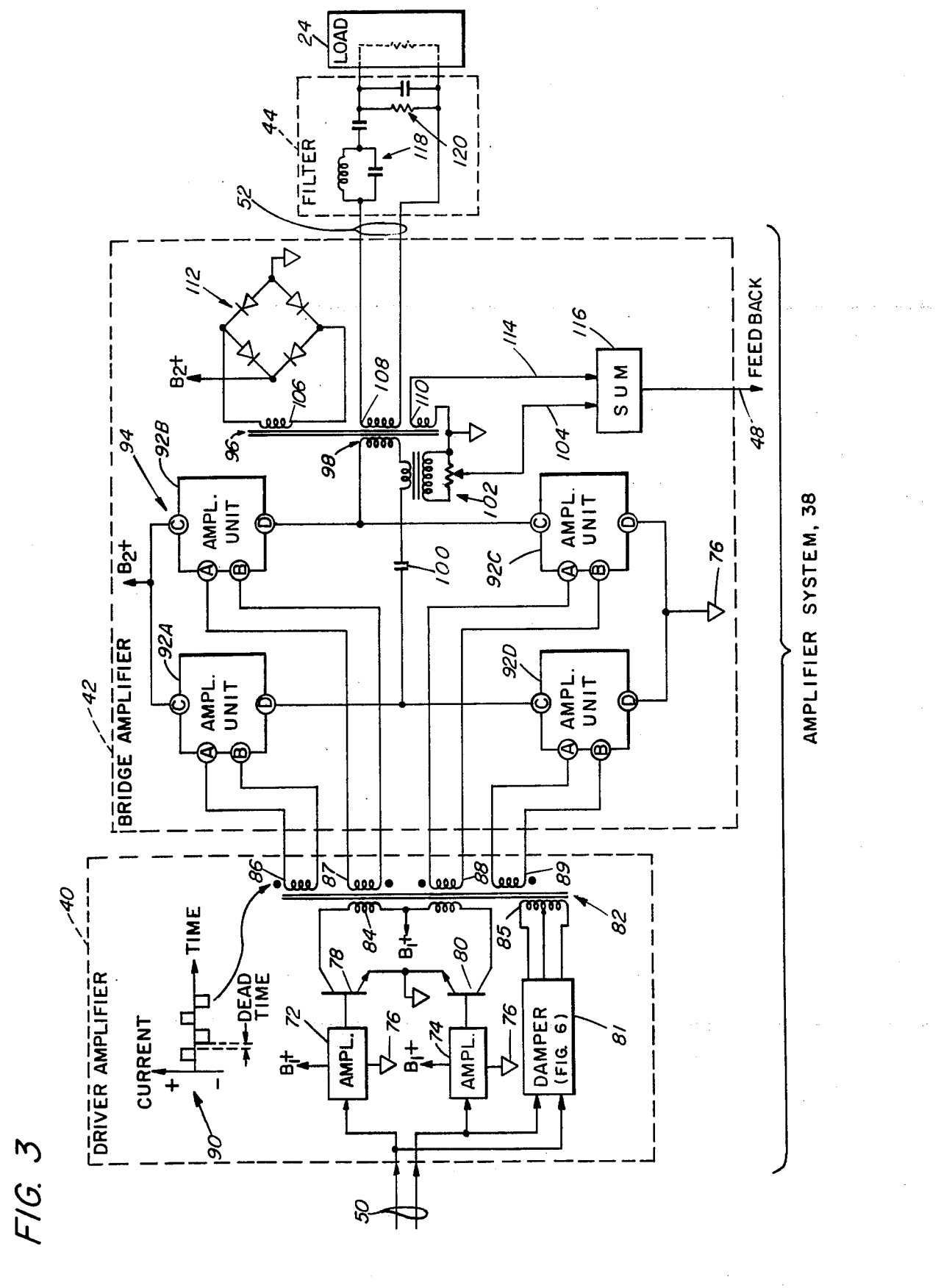
Figure 4:
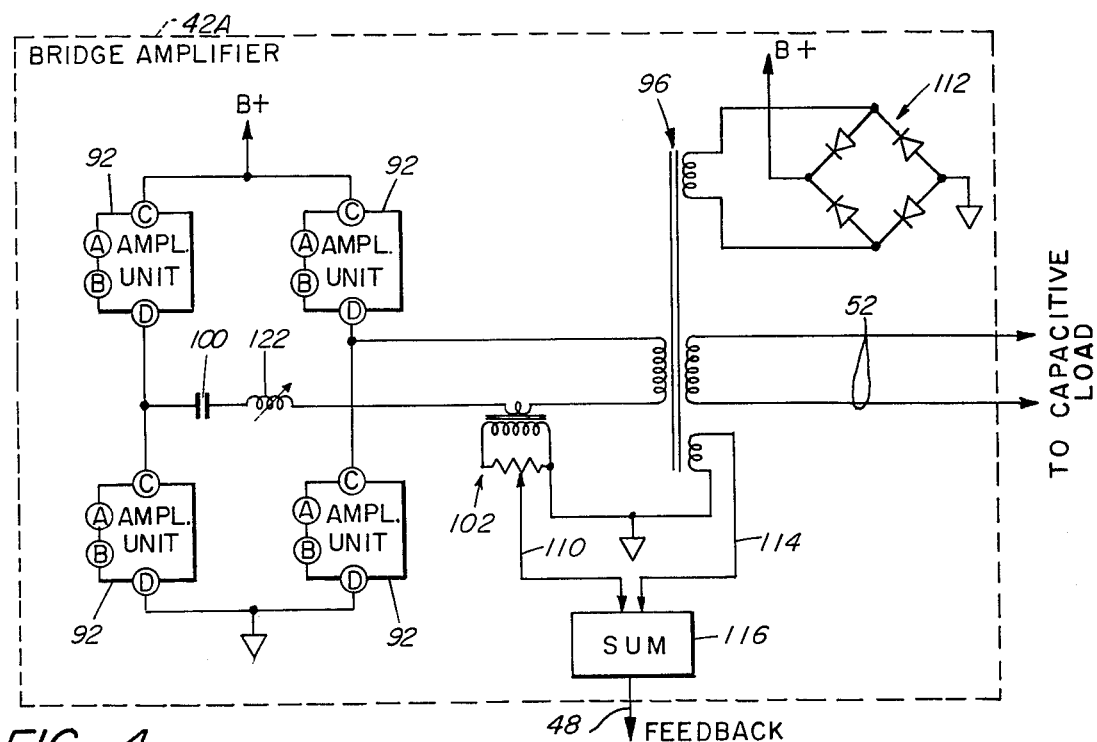
FIG. 4 is a block diagram, partly schematic, of an alternative form of the bridge amplifier of FIGS. 1 and 3 for the situation wherein, in lieu of the speaker of FIG. 1, a capacitive load such as a sonar transducer is utilized, a tuning inductor being supplied within the bridge amplifier.

Referring now to FIG. 1, there is seen a block diagram of an amplifier system 20 for amplifying electric signals produced by a microphone 22 to be presented to a load 24, the load 24 being, by way of example, a speaker for radiating sound waves. In accordance with the invention, the system 20 comprises a preamplifier 26, a differential amplifier 28, a low pass filter 30, a pulse duration modulator 32, a square wave generator 34, a waveform modifier 36 to be disclosed in further detail in FIG. 2, an amplifier system 38 including a driver amplifier 40 and a bridge amplifier 42 as will be disclosed in further detail in FIG. 3, and a band pass filter 44. A graph 46 displays two waveforms in temporal registration with each other, the upper waveform being a portion of a sinusoid which is the waveform of the signals provided by the amplifier 28 to the modulator 32, the lower waveform of the graph 46 being a pulse duration modulated square wave which is the waveform of a signal produced by the modulator 32 and coupled therefrom to the modifier 36.

In operation, sonic signals are converted by the microphone 22 to electric signals which are amplified by the preamplifier 26 and applied to one input terminal of the differential amplifier 28. A feedback signal coupled along line 48 from the bridge amplifier 42 is filtered by the filter 30 and applied to a second input terminal of the differential amplifier 28. Assuming a sound wave incident upon the microphone 22 to have a sinusoidal waveform, the feedback signal as filtered by the filter 30 also has a sinusoidal waveform with the result that the output of the differential amplifier 28, as noted above with reference to the upper waveform of the graph 46, is a sinusoidal waveform. In accordance with the instantaneous amplitude of the output signal of the amplifier 28, the modulator 32 modulates the duration or width of the pulses of a square wave applied thereto by the generator 34 to produce a digital type waveform which, as noted above with reference to the lower waveform of the graph 46, comprises a succession of pulses appearing at a constant repetition frequency but varying in duration. The repetition frequency of the signal produced by the modulator 32 is the same as that of the square wave produced by the generator 34. The widths of the pulses are increased for positive values of the upper waveform of the graph 46 and decreased for negative values of the upper waveform.

The modifier 36, as will be disclosed with reference to FIG. 2, delays the leading edge of each positive going transition and the leading edge of each negative going transition in the signal applied thereto by the modulator 32. The delay of the transitions in the waveform provides time for a conduction turn-off circuit of the amplifier 42, as will be disclosed with reference to FIG. 3, to operate. The amplifier system 38 amplifies the signal applied thereto via line 50 by the modifier 36 and applies the amplified signal via line 52 to the filter 44 with a sample of the signal on line 52 being coupled via line 48 to the filter 30. The filter 44 has a pass band which passes the spectrum of the signal of the microphone 22 to the load 24, the pass band being sufficiently narrow to exclude harmonics of the signal of the microphone 22 and signals at the repetition frequency of the square wave of the generator 34. The filter 30 has sufficient bandwidth to pass the spectrum of the signal of the microphone 22 and has a cut-off frequency for attenuating and phase shifting higher frequency spectral components to produce a stable feedback loop in a manner well known to the design of feedback loops. The square wave signal produced by the generator 34 is thus seen to serve as a carrier upon which the microphone signal 22 is modulated, the carrier spectral line being substantially absent in the lower waveform of the graph 46, particularly when the modulation of the modulator 32 approaches 100%, so that there is little power at the carrier spectral line being amplified by the amplifier system 38. Any residual power at the carrier frequency is attenuated by the filter 44. With respect to the feedback loop, the differential amplifier 28 produces the difference between the feedback and the microphone signals, the output of the amplifier 28 which is the difference between the microphone and feedback signals serving as the loop error signal. Thereby, the amplitude of the signal coupled by the filter 44 to the load 24 accurately and linearly tracks the amplitude of the signal of the microphone 22.

Referring now to FIG. 2, the waveform modifier 36 is seen to comprise one-shot multivibrators 54 and 56, a digital inverter 58, and two AND gates 60 and 62. The input signal to the modifier 36 is coupled via line 64 from the modulator 32 of FIG. 1, a pair of output signals are coupled via line 50 to the driver amplifier 40 of FIG. 1. A graph 66 in FIG. 2 shows three waveforms in time registration, the upper waveform which is the waveform of the input signal on line 64, the middle waveform which is the waveform of the output signal produced by the gate 60, and the lower waveform which is the waveform of the output signal produced by the gate 62. The upper waveform of the graph 66 is a portion of the lower waveform of the graph 46 of FIG. 1 and, by way of example, shows a situation wherein the width of a pulse is equal to the spacing between a pair of pulses.

The input signal on line 64 is coupled via the multivibrator 54 to one input terminal of the gate 60, and is coupled directly to a second input terminal of the gate 60. Via the inverter 58, the input signal of line 64 is also coupled via the multivibrator 56 to one input terminal of the gate 62, and is directly coupled to the second input terminal of the gate 62. The multivibrator 54 is triggered by a positive going leading edge of a pulse of the input signal to produce a negative pulse of substantially narrower width than the pulses of the input signals, the negative pulse being identified by the legend 68 in FIG. 2 and having a duration which will be referred to hereinafter as the dead time. The multivibrator 56 operates in the same manner as does the multivibrator 54 and, accordingly, is triggered by a positive going leading edge of the pulse of the inverted waveform of the input signal on line 64 to produce a negative going pulse, identified by the legend 70, having a duration equal to the dead time of the pulses 68. The gate 60 produces a logic state of 1 or "high" voltage when both the signal voltages at its two input terminals are high. Similarly, the gate 62 produces an output logic state of 1 when both of the signal voltages at its two input terminals are high. As a result, the pulses produced by the gate 60 are of reduced width from the corresponding pulses of the signal on line 64, the reduction in width being equal to the dead time. Similarly, the pulses produced by the gate 62 are of reduced width from the inverted pulses of the signal of line 64, and reduction in width being equal to the dead time. These reductions in width are shown in the graph 66 and, as was noted hereinabove, provide time for a conduction turn-off circuit of FIG. 5 to operate.

Referring now to FIG. 3, the driver amplifier 40 is seen to comprise two amplifiers 72 and 74 of conventional design and being energized by an electrical source such as a battery of which one terminal is labeled B+ and a second terminal 76 is the return terminal of the power supply. The amplifier 40 further comprises two transistors 78 and 80, a damper circuit 81 (to be described in FIG. 6), and a transformer 82 having a center tapped input winding 84, a damper winding 85, and four separate output windings 86–89. A base terminal of the transistor 78 is coupled via the amplifier 72 and line 50 to the output terminal of the gate 60 of FIG. 2. The base terminal of the transistor 80 is coupled via the amplifier 74 and line 50 to the output terminal of the gate 62 of FIG. 2. The transistor 78 and 80 operate in a push-pull configuration with power being coupled to their respective terminals from the B+ terminal and the center tap of the input winding 84. The emitter terminals of the transistor 78 and 80 are coupled to the power supply return terminal 76. The transistor 78 amplifies a signal having the waveform shown as the middle waveform in the graph 66 of FIG. 2 while the transistor 80 amplifies a signal having the waveform shown as the lower waveform of the graph 66 in FIG. 2. The currents impressed in the two sections of the input winding 84 by the transistor 78 and 80 are coupled by the transformer 82 to the output windings 86–89 with a polarity of current flow indicated by the dots appended to the ends of the respective windings 86–89. Thus, it is seen that the currents in the windings 86 and 88 are in phase with each other and of opposite phase to the currents in the windings 87 and 89. An exemplary current waveform for the winding 86 is shown in a graph 90 in which, for convenience in explaining the invention, the positive and negative current pulses are shown as having equal amplitude, it being understood that these amplitudes may differ as a function of forward and reverse resistance of diodes and transistor junctions to be disclosed hereinafter with reference to FIG. 5. In particular, it is noted that the positive current pulses of the graph 90 correspond to the middle waveform of the graph 66 of FIG. 2 while the negative current pulses of the graph 90 correspond to the lower waveform of the graph 66 of FIG. 2. The delay between the trailing edge of one pulse and the leading edge of a succeeding pulse is shown as the dead time in the graph 90, this being the same dead time as is shown in the graph 66 of FIG. 2. Thus, the term "dead time" becomes apparent in that during that period of time, there is no excitation of a current in the winding 86 nor in the other output windings 87–89. It also is noted that the current waveform of the graph 90 is idealized and that, in practice, the square shaped leading and trailing edges of the pulses are somewhat rounded due to bandwidth limitations within the transformer 82.

The bridge amplifier 42 comprises four amplifying units 92 which are further identified by the legends A, B, C and D when it is desired to refer to a specific one of the amplifying units 92. Each amplifying unit 92 has four terminals A, B, C and D, the terminals C and D being utilized for interconnecting the amplifying units 92 in the configuration of a bridge circuit 94, while the terminals A and B in each amplifying unit 92 are utilized for coupling the amplifying units 92A–D respectively to the output windings 86–89. The terminals C of the amplifying units 92A–B are coupled by the B+ terminal of the power supply while the terminals D of the amplifying units 92C–D are coupled to the power supply return terminal 76.

The bridge amplifier 42 further comprises a transformer 96 having an input winding 98 coupled via a capacitor 100 to a pair of opposite nodes of the bridge circuit 94. A current sensor 102 is also coupled in series with the input winding 98 for providing a voltage on line 104 having a magnitude proportional to the current in the input winding 98. The current sensor 102 comprises a transformer having a single turn of wire as its input winding and a multiple turn winding for its output winding with a potentiometer coupled across the terminals of the output winding. The current sensor 102 presents negligible impedance to the circuit of the input winding 98.

The transformer 96 has three output windings 106, 108 and 110, the winding 106 being coupled via a diode bridge 112 to the terminals of the power supply. The winding 108 couples the signal of the winding 98 via the line 52 to the filter 44. The winding 110 provides a voltage on line 114 which is proportional to the voltage produced by the winding 108, the voltage on the lines 114 and 104 being summed together by a summer 116 to provide the feedback signal of line 48.

The output winding 106 in conjunction with the diode bridge 112 serves as a voltage clamping circuit which prevents the voltage of the winding 108 from exceeding a predetermined value. The diodes of the diode bridge 112 are normally open so that no power is extracted from the bridge amplifier 42 via the winding 106. However, in the event that the voltage across the winding 108 exceeds a predetermined value, the diodes of the diode bridge 112 begin to conduct during a portion of each cycle of the signal coupled thereto with the result that power flows from the bridge amplifier 42 via the winding 106 into the power supply. Thereby, excess power is drained off into the power supply and as a result the voltage at the winding 108 does not exceed a predetermined value.

The filter 44 comprises, by a way of example, a resonant tank 118 including an inducator and a capacitor, and a capacitive shunt 120 which includes a resistor and a capacitor. The tank 118 resonates at the repetition frequency of the square wave of the generator 34 of FIG. 1, the tank 118 blocking the passage of signals at the repetition frequency while the shunt 120 shorts out harmonics of the signal of the microphone 22 of FIG. 1, thereby providing a stop band which minimizes the appearance of carrier and harmonic frequency components at the load 24. A capacitor in series with the tank 118 blocks direct current from the load 24. The load 24 is shown as a resistive element which coacts with the filter 44 to provide the foregoing pass band.

Referring now to FIG. 4, there is seen an alternative embodiment of the bridge amplifier 42 of FIG. 3, the embodiment of FIG. 4 being identified by the legend 42A. The circuitry of the amplifier 42A is the same as that of the amplifier 42 except for the inclusion of an additional inductor 122 in series with the input winding of the transformer 96. The amplifier 42A is useful in those situations wherein the signal power produced by the amplifier 42A is coupled via the line 52 to a capacitive load, such as a sonar transducer which is in the form of a slab of a piezoelectric material placed between two metallic plates which serve as the transducer electrodes and produce the configuration of a capacitor.

The inductor 122 may be a variable inductor whereby the inductance thereof is adjusted to resonate with the capacitance of the load and thereby serve to tune the combined circuit of the amplifier 42A and the load 24 for attenuating the presence of signals at the carrier frequency in the load. With the utilization of a capacitive load, the filter 44 of FIG. 3 may be deleted and the load coupled directly via the line 52 to the bridge amplifier 42A, the filter 44 being made unnecessary in view of the resonance between the inductor 122 and the capacitance of the load.

Figure 5:
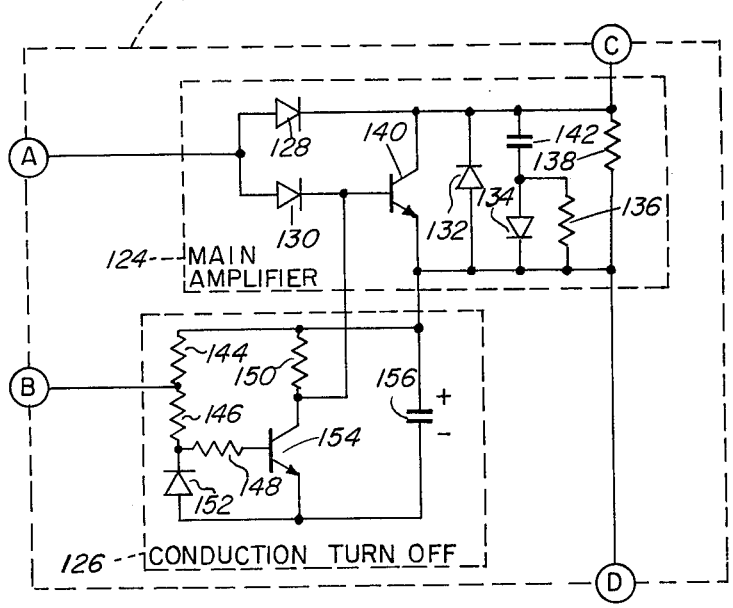
FIG. 5 is a schematic diagram of an amplifying unit of the bridge amplifiers of FIGS. 3 and 4.

Referring now to FIG. 5, an amplifying unit 92 of FIGS. 3 and 4 is seen to comprise a main amplifier 24 and a conduction turn-off circuit 126. The main amplifier 124 comprises four diodes 128, 130, 132 and 134, resistors 136 and 138, a transistor 140 and a capacitor 142. The turn-off circuit 126 comprises four resistors 144, 146, 148 and 150, a diode 152, a transistor 154 and a capacitor 156. During the flow of a positive current from terminal A to terminal B, current flows via the diode 130 into the base terminal of the transistor 140 and via the emitter terminal of the transistor 140 and resistor 144 back to terminal B. The effect of current flow through the capacitor 156 will be described subsequently. During the application of the positive current at terminal A, the transistor 140 is placed in a state of near saturation with collector current being drawn from the power supply via terminal C. The diodes 128 and 130 provide forward conduction respectively to the collector and emitter terminal of the transistor 140 in the manner of a clamp circuit, sometimes referred to as a Baker clamp. As a result of the forward voltage drop across the diodes 128 and 130, the collector to emitter voltage drop across the transistor 140 has a magnitude of approximately two volts, this preventing the attainment of a deep saturation condition of the transistor 140 during the conduction of collector current therethrough.

In order to minimize the power dissipated within the transistor 140, it is desirable to have rapid changes in state between the states of conduction and nonconduction. No power is dissipated in the transistor 140 when there is no current flow, this corresponding to a condition of maximum voltage across the transistor collector-emitter terminal pair. During the state of conduction power is dissipated in the transistor 140 by virtue of the product of the aforementioned two volts multiplied by the collector current plus the product of the base-emitter voltage drop times the base current. The power dissipated in the transistor 140 has a relatively low magnitude as compared to the total signal developed by the pulses of the current flowing from terminal C via the transistor 140 to terminal D. As was seen earlier with reference to FIG. 3, the current flowing from terminal D of the amplifier unit 92A is applied to the transformer 96 for coupling power to the load 24.

To insure a rapid change in state from a state of conduction to a state of nonconduction, the charges accumulated in the base-emitter region of the transistor 140 during the passage of the aforementioned current are rapidly removed. The time required to turn off the transistor to stop the flow of current therethrough is dependent on the amount of charge accumulated in the base-emitter region of the transistor 140. The use of the clamping circuitry of the diodes 128 and 130 precludes the build up of excessive charge in this region by preventing the occurrence of deep saturation. In addition, the turn-off circuit 126 extracts such charge from the base-emitter region of the transistor 140 as has accumulated during the conduction state.

The conduction turn-off circuit 126 operates as a selfcontained circuit with its own power supply, the capacitor 156 serving as that power supply. During the application of successive current pulses from terminal A to terminal B, current flows through the capacitor 156 via the diode 152 and the resistor 146 to terminal B thereby charging the capacitor 156 to a voltage level suitable for operating the transistor 54. Upon termination of a current pulse between terminals A and B, the diode 130 opens and the capacitor 156 provides current to the resistor 150 and to the series combination of resistors 144, 146, and 148, whereby base current and collector current are provided to the transistor 154 respectively via its base and emitter terminals. Sufficient base current is drawn to place the transistor 154 in a state of near saturation in which case the voltage drop across the collector-emitter terminal pair is substantially lower than the voltage drop across the capacitor 156. Thus, a back voltage is applied across the emitter-base terminal pair of the transistor 140 with a resultant flow of current from the base terminal of the transistor 140 to the collector terminal of the transistor 154. Thereby, the base-emitter region of the transistor 140 is discharged of the charge acquired during the conduction state of the transistor 140.

The diode 132 prevents the development of a kick back voltage which may result from the circuitry of FIGS. 3 and 4, namely, the transformer 96 and other sources of inductance such as the inductor 122. The diodes 132 in opposite branches of the bridge 94, such as the diodes 132 of the amplifiers 92A and 92C, coact to provide a flow of reactive power. The capacitor 142 in combination with the diode 134 and resistor 136 provides for the storage of energy in the capacitor 142 during the turn-off of the transistor 140 and thereby provides further protection to the transistor 140 during the current switching operation. The resistor 138 and each of the amplifying units 92 of FIGS. 3 and 4 permit a balancing of the left and right sections of the bridge 94 and establish a quiescent voltage across the transistor 140.

With reference to the balancing of the bridge 94 of FIGS. 3 and 4, it is noted that the capacitor 100 prevents the flow of a steady direct current between the amplifying units 92 of the left side of the bridge and the amplifying units 92 of the right side of the bridge. Thereby, any imbalance in the current gain factors of the transistors 140 in respective amplifying units 92 does not result in an excessive flow of current in any one branch of the bridge 94.

Referring in FIGS. 3 and 4 to the polarities of the windings 86 and 88, it is seen that the amplifying units 92A and 92C conduct current simultaneously while the amplifying units 92B and 92D conduct no current. During the next half of the signal waveform portrayed in the graph 90, the amplifying units 92B and 92D are driven by the windings 87 and 89 into states of conduction while the amplifying units 92A and 92C conduct no current. Thus, the direction of current in the input winding 98 of the transformer 96 alternates in direction to provide both positive and negative pulses of current to the load 24. In view of the filtering provided by the filter 44 and any reactance in both the load 24 and the elements of the bridge amplifier 42, the signal appearing in the load 24 is a sinusoid having an instantaneous amplitude which follows that of the signal produced by the microphone 22 of FIG. 1. The use of the four transistors 140 in the bridge circuit 94 permits application of a greater amount of power to the load 24 than could be provided by simply one or two transistors, the sequential operation of the branches of the bridge 94 providing for a lower average value of power dissipation in each transistor 140.

Figure 6:
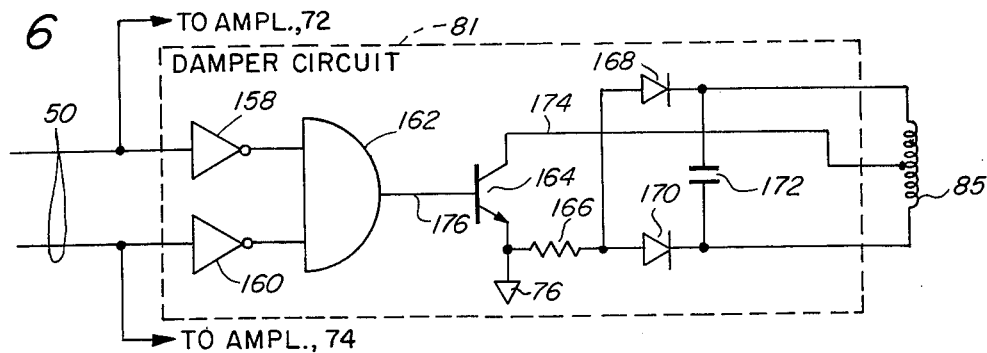
FIG. 6 is a schematic diagram of a damper circuit of FIG. 3.

Referring now to FIG. 6, there is seen a schematic diagram of the damper circuit 81 which was previously referred to in FIG. 3. The damper circuit includes logic circuitry responsive to the signal waveforms on the lines 50 for controlling the flow of current in the damper winding 85 of FIG. 3. The damper circuit 81 comprises two digital inverters 158 and 160 coupled respectively to each of the lines 50, an AND gate 162, a transistor 164 having its collector terminal connected to a center tap terminal of the damper winding 85, a resistor 166, two diodes 168 and 170, and a capacitor 172 coupled across terminals of the damper winding 85. When the transistor 164 is in a state of conduction, current can flow from the emitter terminal of the transistor 164 via the resistor 166, one of the diodes 168 or 170, the upper or lower branch of the damper winding 85 and via its center tap and line 174 to the collector terminal of the transistor 164. When the transistor 164 is in a state of nonconduction, no current flows in the line 174, nor does any current of the damper winding 85 flow through the diodes 168 and 170 since they are coupled together with their cathode terminals directed in opposite directions.

The damper circuit 81 attenuates any ringing of the transformer 82 and the circuitry coupled thereto to insure that the positive and negative waveforms of the graph 90 of FIG. 3 are accurate reproductions of the signal waveforms applied via the lines 50 to the amplifiers 72 and 74 of FIG. 3. The operation of the damper circuit 81 is as follows. The AND gate 162 produces a logic state of 1 corresponding to a relatively high voltage on line 176 when the signals produced by each of the inverters 158 and 160 are simultaneously at logic states of 1. When either or both of the inverters 158 and 160 produce a logic state of 0 or low voltage, the AND gate 162 produces a logic state of 0 on line 176. With reference to the graph 66 of FIG. 2, it is seen that the voltage on one or the other of the lines 50 is always high except during the dead time when a low voltage is applied by both of the lines 50 to the inverters 158 and 160. Accordingly, the high voltage appears on line 176 only during the dead time. The emitter terminal of the transistor 164 is coupled to the power supply return terminal 76 and, accordingly, the application of the high voltage of line 176 to the base terminal of the transistor 164 institutes a state of conduction within the transistor 164, a condition of saturation being produced within the preferred embodiment. As a result, current can flow within the damper winding 85 via the transistor 164 and one or the other of the diodes 168 and 170 only during the dead time.

The damper circuit 81, in attenuating the aforementioned ringing, insures that the dead time appears in the current of the output winding 86 of FIG. 3, as shown in the waveform of the graph 90, and in the currents of the output windings 87–89. As seen in the graph 90, the value of the current during the dead time is zero. A ringing in the circuitry coupled to the transformer 82 would result in a non-zero value of the current during the dead time. Any such non-zero current is magnetically coupled to the damper winding 85 via the action of the transformer 82 and is conducted via the transistor 164 through the resistor 166 wherein it is dissipated. In the preferred embodiment of the invention, the resistor 166 has a value of approximately 5 ohms. The capacitor 172 absorbs energy that may be present in voltage transients produced by the damper winding 85 and thereby insures smooth operation of the damper circuit 81. When current flows through one branch of the winding 84 of FIG. 3, then, during the immediately succeeding dead time interval, current flows through one branch of the damper winding 85; and when current flows through the other branch of the winding 84, then, during the immediately succeeding dead time interval, current flows through the other branch of the damper winding 85. Thereby, during alternate dead time intervals, alternate ones of the diodes 168 and 170 conduct current via alternate branches of the damper winding 85. In this way, the damper circuit 81 operates symmetrically with respect to the signals applied to each of the amplifiers 72 and 74 of FIG. 3 to provide the desired waveform of graph 90 during each of the dead time intervals.

The selection of the carrier frequency, or pulse repetition frequency of the square wave carrier produced by the generator 34 of FIG. 1, is based on the Nyquist criterion which requires that the sampling frequency be at least double the highest significant frequency in the spectrum of data to be transmitted from the microphone 22 of FIG. 1 to the load 24. In addition, a still higher carrier frequency such as ten times the highest frequency of the signal spectrum, has been found to produce greater linearity in the amplification by reducing the fractional change in width of adjacent pulses of the signal on line 64 from the modulator 32 of FIG. 1. For example, a square wave repetition frequency of 30 kHz has been found acceptable for voice communication as in telephony using a pass band of approximately 3 kHz. In a preferred embodiment of the invention, the carrier spectral component appearing in the load 24 has been found to be attenuated by a factor of 30 dB. A higher power supply voltage may be utilized for the bridge amplifier 42 than for the driver amplifier 40 as is indicated by the subscripts 1 and 2 in FIG. 3 appended to the B+ terminals of the power supply. With respect to the bridge amplifier 42, a 300 volt supply has been utilized, and the transistors 140 are high voltage transistors such as those manufactured by TRW type number 400-12 and by SOLITRON type number 93-30. Efficiencies of approximately 83% have been obtained wherein 17% of the power is dissipated in the driver and bridge amplifiers 40 and 42. The amplifier system 38 has been successfully operated at carrier frequencies as high as 70 kHz. A delay time of 1.5 milliseconds has been utilized.

It is understood that the above described embodiments of the invention are illustrative only and that modifications thereof may occur to those skilled in the art. Accordingly, it is desired that this invention is not to be limited to the embodiments disclosed herein but is to be limited only as defined by the appended claims.

What is claimed is:

1. A system for amplifying an input signal comprising:
    pulse duration modulator means for modulating a carrier signal with said input signal to produce a modulated signal, said carrier signal comprising a succession of pulse signals each of which has a leading edge and a trailing edge, said modulator means varying the durations of successive ones of said pulse signals according to variations in the amplitude of said input signal;

means coupled to said modulator means for modifying the waveform of said modulated signal by delaying the occurrence of an edge of one of said pulse signals relative to an edge of an adjacent one of said pulse signals to provide a delay time between said pulse signals;

an amplifier system coupled to said modifying means for amplifying said modulated signal, said amplifier system comprising groups of amplifying means which are interconnected for coupling to a load, means for sequentially activating individual ones of said groups of amplifying means in synchronism with sequential ones of said leading edges, said activating means terminating the activity of individual ones of said amplifying means in synchronism with sequential ones of said trailing edges to insure a cessation of activity in all of said amplifying means during a portion of each of said dead times; and filtering means coupled between said amplifier system and said load, said filtering means having a stop band including the repetition frequency of said carrier signal.

2. A system according to claim 1 wherein said filtering means provides an amplitude modulated signal to said load and wherein said activating means comprises a push-pull amplifier having a transformer with a plurality of output windings coupled respectively to individual ones of said amplifying means.

3. A system according to claim 2 wherein a pair of said amplifying means in one of said groups is serially coupled to said load.

4. A system according to claim 3 wherein said amplifying means comprises an amplifying circuit including a transistor, first and second input terminals, first and second diodes, a base terminal of said transistor being coupled via said first diode to said first input terminal, a collector terminal of said transistor being coupled via said second diode to said first input terminal, and an emitter terminal of said transistor being coupled to said second input terminal whereby current flows from said first input terminal via said first diode and said transistor to said second input terminal.

5. A system according to claim 4 wherein said activating means includes a terminating means in each of said amplifying means coupled between said emitter terminal of said amplifying means and said second input terminal of said amplifying means, said terminating means comprising a transistor, a capacitor for storing energy for operating said terminating means, and a set of serially connected resistors for coupling base current to said transistor of said terminating means, said serially connected resistors being coupled to said second input terminal of said amplifying means, one resistor of said serially connected resistors being coupled to said emitter terminal and a second resistor of said serially connected resistors being coupled via said capacitor to said emitter terminal, one terminal of said capacitor being coupled to an emitter terminal of said transistor of said terminating means, a second terminal of said capacitor being coupled to said emitter terminal of said transistor of said amplifying circuit.

6. A system according to claim 1 wherein a plurality of said amplifying means is arranged in the form of a bridge circuit, said amplifier system including an output transformer having an input winding and a capacitor coupled thereto, two of said amplifying means in one of said groups of amplifying means being serially coupled with said input winding of said output transformer and said capacitor.

7. A system according to claim 6 wherein said amplifier system further comprises an inductor serially coupled to said input winding of said output transformer and to said capacitor for tuning capacitance of a load coupled to an output winding of said output transformer.

8. A system according to claim 2 wherein said amplifier system further comprises damping means coupled between input terminals of said push-pull amplifier and said transformer, said damping means comprising an AND gate coupled to said input terminals and having an output signal thereof coupled between a center tap and a pair of out board terminals of a winding of said transformer, said damping means being coupled to said activating means for maintaining said synchronism between said terminating of activity and said trailing edges in accordance with said dead time interval.

9. In combination:

a plurality of amplifiers each of which amplifies the power of an electric signal coupled to an input terminal thereof;

means for coupling said plurality of amplifiers to a load;

means for sequentially activating pairs of said amplifiers to provide power for said load; and wherein said activating means comprises means for generating a succession of temporally spaced-apart signal pulses of said electric signal, each of said amplifiers being activated during a pulse of said signal pulses, each of said signal pulses having a leading edge and a trailing edge, said activating means including a circuit in each of said amplifiers responsive to said trailing edge for terminating said activity in each of said amplifiers, said terminating circuit in one of said amplifiers being synchronized with the terminating circuit in a second of said amplifiers during a portion of the time between a trailing edge of one of said signal pulses and the leading edge of a second of said signal pulses.

10. A combination according to claim 9 wherein said amplifiers are coupled together in the configuration of a bridge circuit.

11. A combination according to claim 10 wherein only one amplifier in any one section of said bridge circuit is activated at one time by said activating means.

12. A combination according to claim 11 wherein said coupling means provides for the coupling of one node from each section of said bridge circuit to said load.

13. In combination:

a plurality of amplifiers;

means for coupling said plurality of amplifiers to a load;

means for activating a first gorup of said amplifiers to provide a flow of power within said coupling means;

means responsive to said ativating means for terminating said flow of power in said first group of said amplifiers;

means responsive to said activating means for initiating a flow of power by a second group of said amplifiers subsequent to the termination of said flow of power of said first group of said amplifiers; and means coupled between said activating means and a signal to be amplified by said amplifiers for modifying said signal, said modifying means including a delay circuit for imparting a delay between a trailing edge of a pulse of said signal and a leading edge of a second pulse of said signal to insure a delay between said terminating of power to said first group of said amplifiers and said initiating of power by said second group of said amplifiers.

* * * * *